(12) United States Patent
Son et al.

(10) Patent No.: US 8,441,862 B2
(45) Date of Patent: May 14, 2013

(54) PROGRAM METHOD OF MULTI-BIT MEMORY DEVICE AND DATA STORAGE SYSTEM USING THE SAME

(75) Inventors: Hong Rak Son, Anyang-si (KR); Han Woong Yoo, Seoul (KR); Jaehong Kim, Seoul (KR); Jun Jin Kong, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 222 days.

(21) Appl. No.: 13/080,809

(22) Filed: Apr. 6, 2011

(65) Prior Publication Data

US 2011/0249496 A1 Oct. 13, 2011

(30) Foreign Application Priority Data

Apr. 12, 2010 (KR) .................. 10-2010-0033422

(51) Int. Cl.
*G11C 16/06* (2006.01)
(52) U.S. Cl.
USPC ............ 365/185.22; 365/185.03; 365/185.18
(58) Field of Classification Search ............ 365/185.03, 365/185.22, 185.18
See application file for complete search history.

(56) References Cited

U.S. PATENT DOCUMENTS

| 6,091,640 | A | 7/2000 | Kawahara et al. |
| 7,092,290 | B2 | 8/2006 | Hemink |
| 7,920,420 | B2 * | 4/2011 | Lee .......................... 365/185.03 |
| 2006/0227618 | A1 * | 10/2006 | Lee .......................... 365/185.22 |
| 2008/0165579 | A1 * | 7/2008 | Lee .......................... 365/185.03 |
| 2009/0296466 | A1 * | 12/2009 | Kim et al. ................. 365/185.03 |

FOREIGN PATENT DOCUMENTS

| KR | 10-2007-0090020 A | 9/2007 |
| KR | 10-2009-0009954 A | 1/2009 |

* cited by examiner

*Primary Examiner* — Toan Le
(74) *Attorney, Agent, or Firm* — Muir Patent Consulting, PLLC

(57) ABSTRACT

Provided is a program method of a multi-bit memory device with memory cells arranged in rows and columns. The program method includes a programming each memory cell of the first group of memory cells to a state within a first group of states according to a verify voltage level of a first group of verify voltage levels within a first range of levels, and programming each memory cell of the second group of memory cells to a state within a second group of states according to a verify voltage level of a second group of verify voltage levels within a second range of levels. The lowest verify voltage level in the second range of levels is higher than the highest verify voltage level in the first range of levels. A first voltage difference between adjacent verify voltage levels within the first range of levels is different from a second voltage difference between the highest verify voltage level of the second group of verify voltage levels and the lowest verify voltage level of the third group of verify voltage levels.

20 Claims, 12 Drawing Sheets

PROGRAM METHOD OF MULTI-BIT MEMORY DEVICE AND DATA STORAGE SYSTEM USING THE SAME

CROSS-REFERENCE TO RELATED APPLICATIONS

This U.S. non-provisional patent application claims priority under 35 U.S.C. §119 to Korean Patent Application No. 10-2010-0033422, filed on Apr. 12, 2010, the entire contents of which are hereby incorporated by reference.

BACKGROUND

The present disclosure relates to a program method of a multi-bit memory device and a data storage system using the same.

Semiconductor memory devices are microelectronic devices that are used to design digital logic circuits such as microprocessor-based applications and computers for the fields ranging from satellite to consumer electronics. Therefore, an advance in memory fabrication technology, including technology development and process improvement obtained through scaling for high speed and high integration density, assists in establishing the performance standards of other digital logic systems.

Semiconductor memory devices are generally classified into volatile memory devices and nonvolatile memory devices. Examples of the volatile memory devices include static random-access memory (SRAM) devices and dynamic random-access memory (DRAM) devices. The SRAM devices store logic information by setting the logic state of a bistable flip-flop, and the DRAM devices store logic information by charging a capacitor. The volatile memory devices store and read data in a power-on state, but lose the stored data in a power-off state.

Examples of the nonvolatile memory devices include magnetic read-only memory (MROM) devices, programmable read-only memory (PROM) devices, erasable programmable read-only memory (EPROM) devices, electrically erasable programmable read-only memory (EEPROM) devices, and phase-change random-access memory (PRAM) devices. The nonvolatile memory devices can retain data stored therein even when power supply thereto is interrupted. The state of data stored in the nonvolatile memory devices may be permanent or reprogrammable according to memory fabrication technologies. The nonvolatile memory devices are used to store programs and microcodes in various applications such as computers, avionics, communications, and consumer electronic technologies. A combination of volatile and nonvolatile memory storage modes in a single chip may also be used in devices such as nonvolatile RAMs (nvRAMs) in a system that requires quick and reprogrammable nonvolatile memories. In addition, specific memory structures including some additional logic circuits have been developed to optimize the performance for application-oriented tasks.

Since nonvolatile memory devices such as MROM devices, PROM devices and EPROM devices are not allowed to erase and write, it is not easy for general users to update data stored in such nonvolatile memory devices. On the other hand, since nonvolatile memory devices such as EEPROM devices and PRAM devices are electrically erasable and programmable, their applications are expanding to auxiliary memory devices or system programming that require continuous data update.

SUMMARY

The present disclosure provides a program method of a multi-bit memory device and a data storage system using the same, which can reduce the amount of data necessary for a fine program operation.

According to one embodiment, a program method for a multi-bit memory device is disclosed. The program method includes a first step of programming a first group of memory cells of the multi-bit memory device to a first state of a first group of states according to a first verify voltage level of a first group of verify voltage levels, and programming a second group of memory cells of the multi-bit memory device to a second state of the first group of states according to a second verify voltage level of the first group of verify voltage levels. The program method further includes a second step of programming each memory cell of the first group of memory cells to a state within a second group of states according to a verify voltage level of a second group of verify voltage levels within a first range of levels, and programming each memory cell of the second group of memory cells to a state within a third group of states according to a verify voltage level of a third group of verify voltage levels within a second range of levels. The lowest verify voltage level in the second range of levels is higher than the highest verify voltage level in the first range of levels. A first voltage difference between adjacent verify voltage levels within the first range of levels is different from a second voltage difference between the highest verify voltage level of the second group of verify voltage levels and the lowest verify voltage level of the third group of verify voltage levels.

In further embodiment, a program method for a multi-bit memory device is disclosed. The program method includes programming a first group and a second group of memory cells of the multi-bit memory device. The programming includes each memory cell of the first group of memory cells programming to a state within a first group of states, based on a verify voltage level of a first group of verify voltage levels within a first range of levels. The programming additionally includes each memory cell of the second group of memory cells programming to a state within a second group of states, based on a verify voltage level of a second group of verify voltage levels within a second range of levels. The lowest verify voltage level in the second range of levels is higher than the highest verify voltage level in the first range of levels. A first voltage difference between adjacent verify voltage levels within the first range of levels is smaller than a second voltage difference between the highest verify voltage level of the second group of verify voltage levels and the lowest verify voltage level of the third group of verify voltage levels.

In another embodiment, a multi-bit memory device is disclosed. The multi-bit memory device includes a memory cell array, a voltage generator and a control circuit. The memory cell array has memory cells arranged in rows and columns. The voltage generator is configured to generate word line voltages to be applied to a selected word line of the memory cell array. The control circuit is configured to control the voltage generator to operate a first step of programming and a second step of programming. The first step of programming includes programming a first group of memory cells of the multi-bit memory device to a first state of a first group of states according to a first verify voltage level of a first group of verify voltage levels, and programming a second group of memory cells of the multi-bit memory device to a second state of the first group of states according to a second verify voltage level of the first group of verify voltage levels. The second step of programming includes programming each memory cell of the first group of memory cells to a state within a second group of states according to a verify voltage level of a second group of verify voltage levels within a first range of levels, and programming each memory cell of the second group of memory cells to a state within a third group of states according to a verify voltage of a third group of verify voltage levels within a second range of levels. The lowest verify voltage level in the second range of levels is higher than the highest verify voltage level in the first range of levels. A first voltage difference between adjacent verify voltage levels within the first range of levels is smaller than a second voltage difference between the highest verify voltage level of the second group of verify voltage levels and the lowest verify voltage level of the third group of verify voltage levels.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
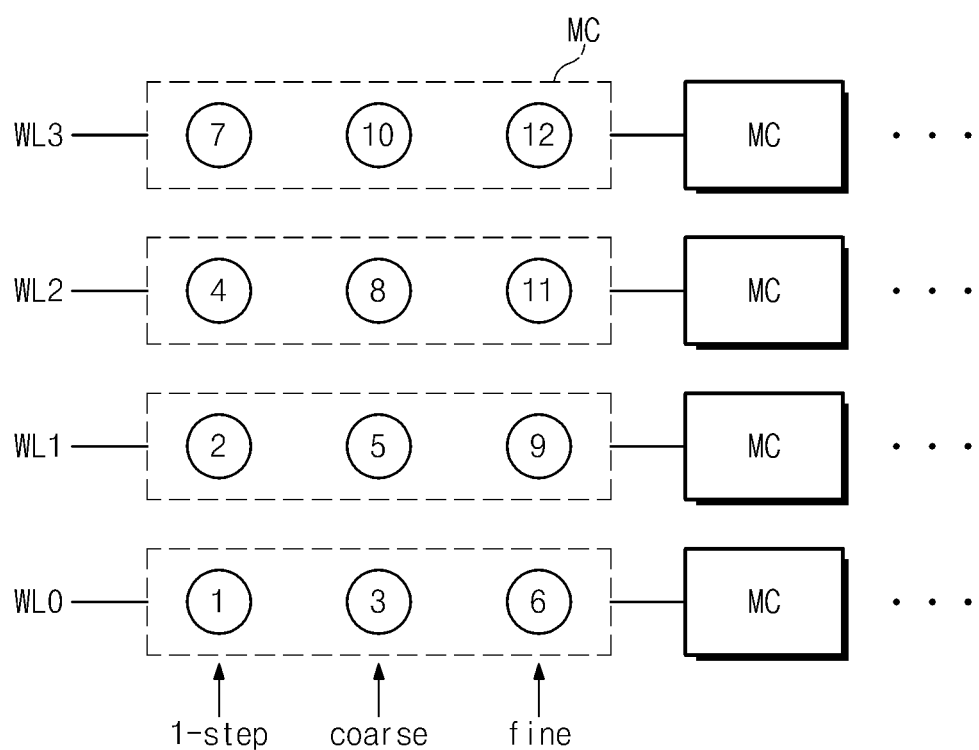
FIG. 1 is a diagram illustrating an example of an address scramble method applied to a multi-level memory device to efficiently manage coupling.

Preferred embodiments of the inventive concept will be described below in more detail with reference to the accompanying drawings. Advantages and features of the inventive concept, and implementation methods thereof will be clarified through the following embodiments described with reference to the accompanying drawings. The inventive concept may, however, be embodied in different forms and should not be construed as limited to the embodiments set forth herein.

In the drawings, exemplary embodiments of the inventive concept are exaggerated for clarity of illustration and are not limited to illustrated specific shapes. Throughout the specification and drawings, like reference numerals denote like elements.

As used herein, the term "and/or" includes any and all combinations of one or more of the associated listed items. Also, when one part (or element, device, etc.) is referred to as being "connected/coupled" to another part (or element, device, etc.), it should be understood that the former may be "directly connected" to the latter, or "indirectly connected" to the latter through at least one intervening part (or element, device, etc.). The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

With an increase in the number of data bits stored in each memory cell, it is increasingly difficult to secure the reliability of a memory device storing multi-bit/multi-level data (hereinafter referred to as a multi-level memory device). A typical example of the factors degrading the reliability is a variation in threshold voltages caused by the coupling between adjacent memory cells. For example, a threshold voltage of a previously programmed memory cell may vary due to the coupling caused when a memory cell adjacent to the previously programmed memory cell is programmed. An example of an address scramble method applied to a multi-level memory device to efficiently manage such a coupling is illustrated in FIG. 1.

Figure 4:
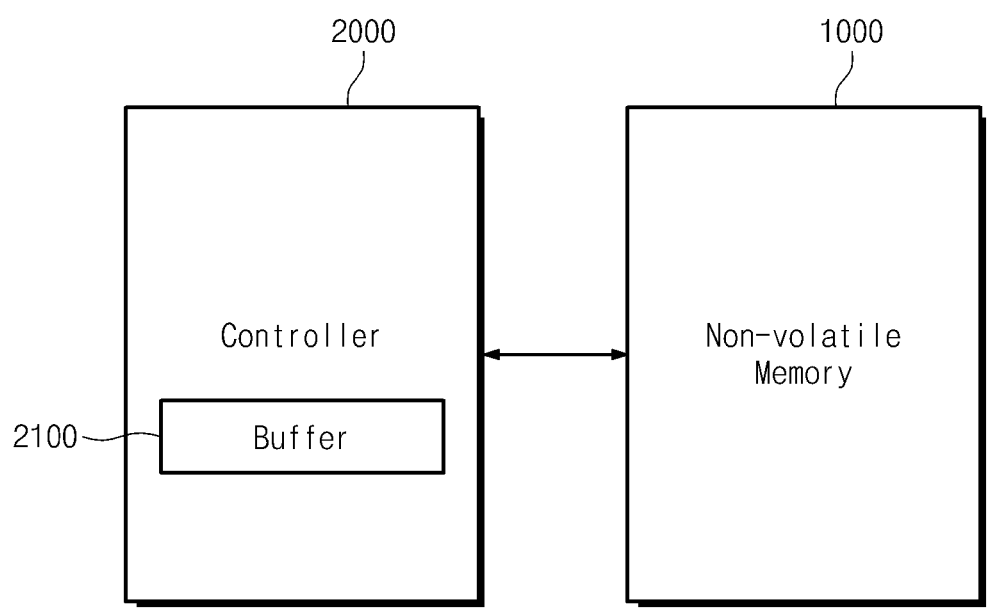
FIG. 4 is a block diagram of a data storage system according to an exemplary embodiment.

An address scramble method will be described under the assumption that 3 or 4-bit data are stored in one memory cell. For convenience' sake, only 4 word lines WL0~WL3 are illustrated in FIG. 4. A plurality of memory cells MC are connected to each of the word lines WL0~WL3. First, a 1-step (or a first step) program operation is performed to store 2-bit data in each of the memory cells connected to the first word line WL0. That is, in the 1-step program operation, a first 2-bit data are stored in the memory cells connected to the first word line WL0. This is represented by ① in FIG. 1. That is, the first 2-bits (e.g., most significant bits) can be programmed. Thereafter, a 1-step program operation is performed on memory cells connected to the second word line WL1. This is represented by ② in FIG. 1. Thereafter, a coarse (or a second step) program operation is performed to store remaining 1 or 2-bit data in each of the memory cells connected to the first word line WL0 under the second word line WL1. This is represented by ③ in FIG. 1. That is, the remaining 1 or 2-bits may be programmed. Thereafter, a 1-step program operation is performed on the third word line WL2. This is represented by ④ in FIG. 1. Thereafter, a coarse program operation is performed to store the remaining 1 or 2-bit data in each of the memory cells connected to the second word line WL1. This is represented by ⑤ in FIG. 1. Thereafter, a fine (or a third step)

program operation is performed on the first word line WL0. This is represented by ⑥ in FIG. 1. Thereafter, the 1-step, coarse and fine program operations are performed sequentially according to the above-described program sequence of FIG. 1. A method of selecting word lines according to the program sequence of FIG. 1 is referred to as an address scramble method.

When the 1-step program operation and the coarse program operation are completed, threshold voltage distributions (e.g., 8 or 16 threshold voltage distributions) corresponding to 3 or 4-bit data are all formed. According to the above-described address scramble method, the 1-step program operation, the coarse program operation and the fine program operation are not successively performed on each word line, but the 1-step program operation, the coarse program operation or the fine program operation is performed on each word line after/before the 1-step program operation, the coarse program operation or the fine program operation performed on other word lines. This means that the 1-step programmed/coarse programmed/fine programmed memory cells experience the coupling from adjacent memory cells to be 1-step programmed/coarse programmed/fine programmed. Therefore, even if all the threshold voltage distributions are formed according to the completion of the coarse program operation, a margin between the threshold voltage distributions may be insufficient to clearly divide the threshold voltage distributions (see FIG. 2). The fine program operation is performed to secure the margin sufficient to clearly divide the threshold voltage distributions. The fine program operation is performed to reduce the width of each threshold voltage distribution, and is performed using verify voltages that are respectively higher by a predetermined voltage level than the verify voltages of threshold voltage distributions used in the coarse program operation. This program method makes it possible to reduce the coupling between adjacent memory cells. The above-described program method is referred to as a coarse-fine program method, a reprogram method/algorithm, or a 3-step program method.

According to the above-described program method, it is necessary to retain data stored in the memory cells of a word line until the completion of the fine program operation on the word line. For example, the 1-step program operation is performed on the basis of data provided from the memory controller to the multi-bit memory device, and the coarse program operation is performed on the basis of the data stored in the memory through the 1-step program operation and data provided from the memory controller. The fine program operation is performed on the basis of the data stored through the 1-step program operation and the coarse program operation. However, as described above, it may be difficult to accurately read data stored through the 1-step program operation and the coarse program operation. Therefore, data necessary for the fine program operation may additionally be provided from the memory controller to the multi-bit memory device. In that case, the memory controller retains data stored in memory cells of a word line until the fine program operation is completed on the word line. This means that the memory controller is provided with a large-capacity buffer memory for retaining data necessary for the fine program operation. In another embodiment, the multi-bit memory device may be configured to retain data stored in memory cells of a word line until the completion of the fine program operation on the word line, which may cause a burden in the implementation of the multi-bit memory device in terms of the chip area.

Figure 2:
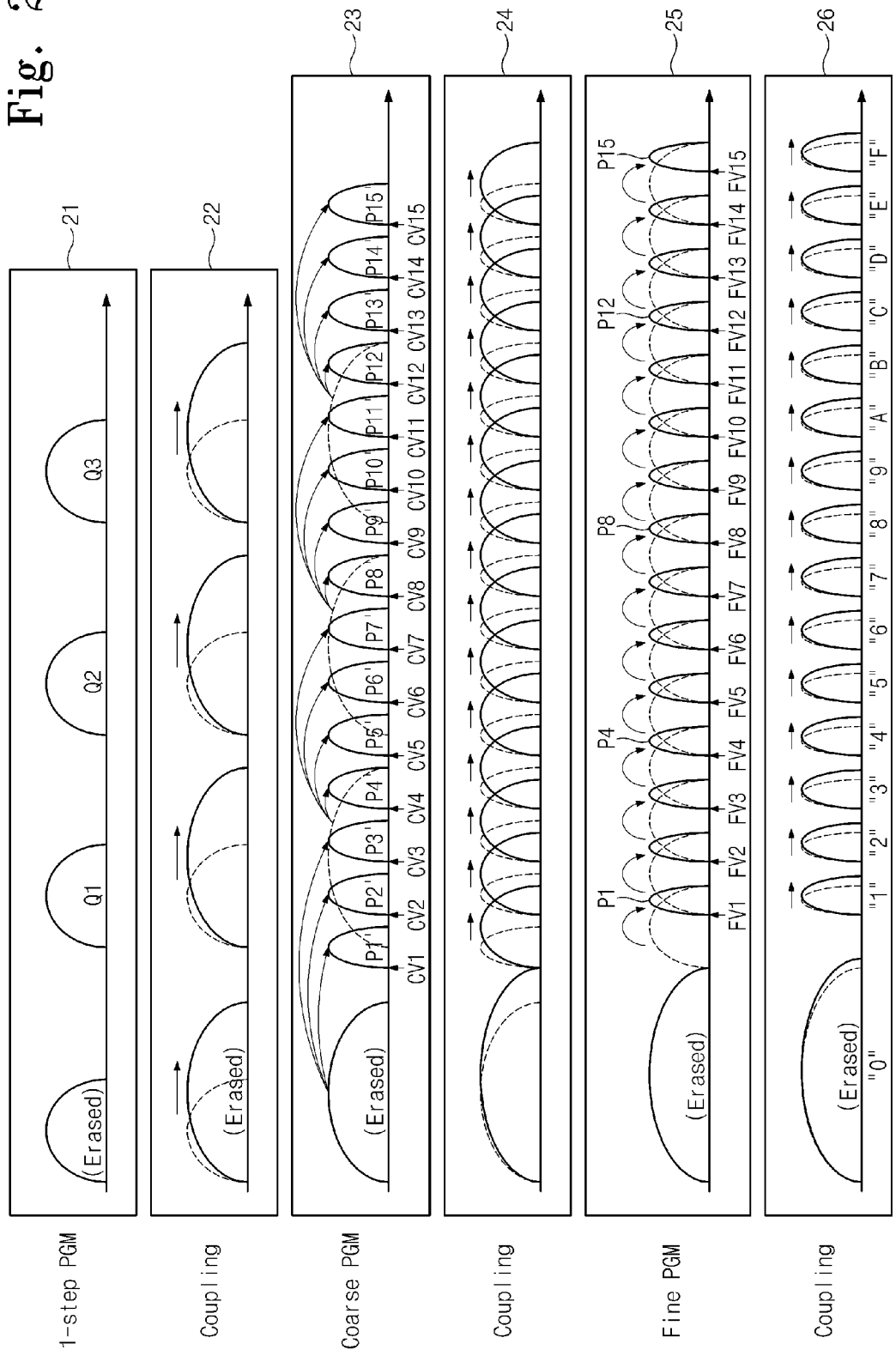
FIG. 2 is a diagram illustrating a typical reprogram method.
Figure 3:
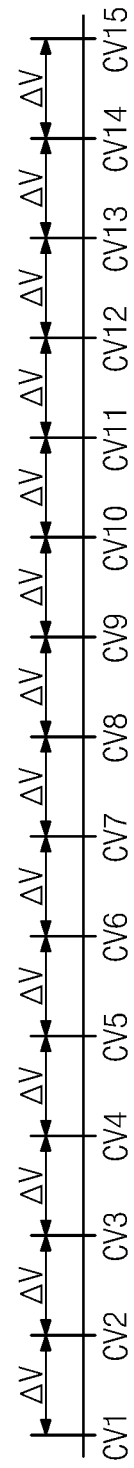
FIG. 3 is a diagram illustrating verify voltages used in a coarse program operation illustrated in FIG. 2.

FIG. 2 is a diagram illustrating a typical 3-step program (reprogram) method. FIG. 3 is a diagram illustrating the verify voltages used in the coarse program operation of FIG. 2. For the convenience of description, it is assumed that each memory cell stores 4-bit data and a program operation is performed according to a 3-step program method. Under the above assumption, a program method according to a 3-step program manner will be described below with reference to the accompanying drawings.

Referring to FIG. 1, a first 2-bit data (also referred to as 2-page data) are simultaneously stored in each of memory cells of a selected word line (e.g., WL0 of FIG. 1). At this point, as illustrated in a box 21 of FIG. 2, memory cells in a threshold voltage distribution corresponding to an erase state E are programmed to have threshold voltages of threshold voltage distributions corresponding respectively to program states Q1, Q2 and Q3 according to the data to be programmed.

As described above, a coarse program operation on the 1-step programmed memory cells in the selected word line (e.g., WL0) is performed after a 1-step program operation on memory cells in an adjacent word line (e.g., WL1) is performed. At this point, as illustrated in a box 22 of FIG. 2, the distributions of the 1-step programmed memory cells in the selected word line (e.g., WL0) are widened by the coupling occurring when the memory cells in the adjacent word line (e.g., WL1) are programmed.

Thereafter, remaining 2-bit data are simultaneously stored in the each of memory cells of the selected word line WL0. At this point, as illustrated in a box 23 of FIG. 2, memory cells in a threshold voltage distribution corresponding to each state are programmed to have threshold voltages of the corresponding threshold voltage distributions. For example, memory cells in a threshold voltage distribution corresponding to an erase state E are programmed to have threshold voltages of threshold voltage distributions corresponding respectively to program states E~P3' according to the data to be programmed. Memory cells in a threshold voltage distribution corresponding to a program state Q1 are programmed to have threshold voltages of threshold voltage distributions corresponding respectively to program states P4'~P7' according to the data to be programmed. Memory cells in a threshold voltage distribution corresponding to a program state Q2 are programmed to have threshold voltages of threshold voltage distributions corresponding respectively to program states P8'~P11' according to the data to be programmed. Memory cells in a threshold voltage distribution corresponding to a program state Q3 are programmed to have threshold voltages of threshold voltage distributions corresponding respectively to program states P12'~P15' according to the data to be programmed.

Herein, the states E, Q1, Q2 and Q3 of the 1-step programmed memory cells are referred to as a source state, and the states of the coarse programmed memory cells are referred to as a target state. Memory cells in a source state E are programmed to have one of a first group of the target states E, P1', P2' and P3' according to data to be programmed. Memory cells in a source state Q1 are programmed to have one of a second group of the target states P4', P5', P6' and P7' according to data to be programmed. Memory cells in a source state Q2 are programmed to have one of a third group of the target states P8', P9', P10' and P11' according to data to be programmed. Memory cells in a source state Q3 are programmed to have one of a fourth group of the target states P12', P13', P14' and P15' according to data to be programmed.

As described above, a fine program operation on the coarse programmed memory cells in the selected word line (e.g., WL0) is performed after a 1-step program operation and a coarse program operation are performed on the memory cells in adjacent word lines (e.g., WL2 and WL1). At this point, as illustrated in a box 24 of FIG. 2, the distributions of the coarse programmed memory cells in the selected word line (e.g., WL0) are widened by the coupling occurring when memory cells in the adjacent word lines (e.g., WL2 and WL1) are programmed. Therefore, it may be difficult to accurately read data from the coarse programmed memory cells.

The memory cells in the word line WL0 are programmed to have the final threshold voltage distributions E and P1~P15 as illustrated in a box 25 of FIG. 2. This operation is referred to as a fine program operation. As described above, the fine program operation requires previously programmed data (e.g., the first to fourth page data), and it is performed on the basis of data provided from the memory controller (or data retained by the memory device) because it is difficult to accurately read the previously programmed data from the memory cells belonging to the word line WL0. As illustrated in a box 26 of FIG. 2, the distributions of the fine programmed memory cells may also be widened by the coupling occurring when memory cells in adjacent word lines are programmed.

Thereafter, a 1-step program operation, a coarse program operation and a fine program operation are performed on each word line according to the program sequence of FIG. 1 in the same way as described with reference to FIG. 2.

As can be seen from the box 23 of FIG. 2, the above-described coarse program operation requires verify voltages CV1~CV15 for determining whether memory cells are programmed to desired states. As illustrated in FIG. 3, voltage differences between the verify voltages CV1~CV15 are set to be equal. For example, the upper verify voltage (e.g., CV$i$) (i=2~15) is higher by $\Delta V$ than the lower verify voltage (e.g., CV$i-1$).

As can be seen from FIG. 2, the verify voltages CV1~CV15 used to determine the threshold voltage distributions P1'~P15' of the box 23 are lower than the corresponding verify voltages FV1~FV15 used to determine the final threshold voltage distributions P1~P15 of the box 25. For example, the verify voltage CV1 used to determine the threshold voltage distribution P1' is lower than the verify voltage FV1 used to determine the final threshold voltage distribution P1.

FIG. 4 is a block diagram of a data storage system according to an exemplary embodiment.

Referring to FIG. 4, a data storage system according to an exemplary embodiment may include a nonvolatile memory device (e.g., a multi-bit memory device) 1000 and a controller 2000. The multi-bit memory device 1000 includes one or more memory chips. The controller 2000 controls the multi-bit memory device 1000 in response to a request from an external source (e.g., a host). The controller 2000 is used to temporarily store data transmitted from the external source to the multi-bit memory device 1000 or transmitted from the multi-bit memory device 1000 to the external source. Although not illustrated in FIG. 4, the controller 2000 may further include a processing unit and an error correction code (ECC) encoding/decoding unit. In one embodiment, the controller 2000 controls a program operation for the multi-bit memory device 1000 according to the 3-step program method and the address scramble method described with reference to FIG. 1. However, it will be well understood that the 3-step program method and the address scramble method are not limited to those described herein.

Figure 5:
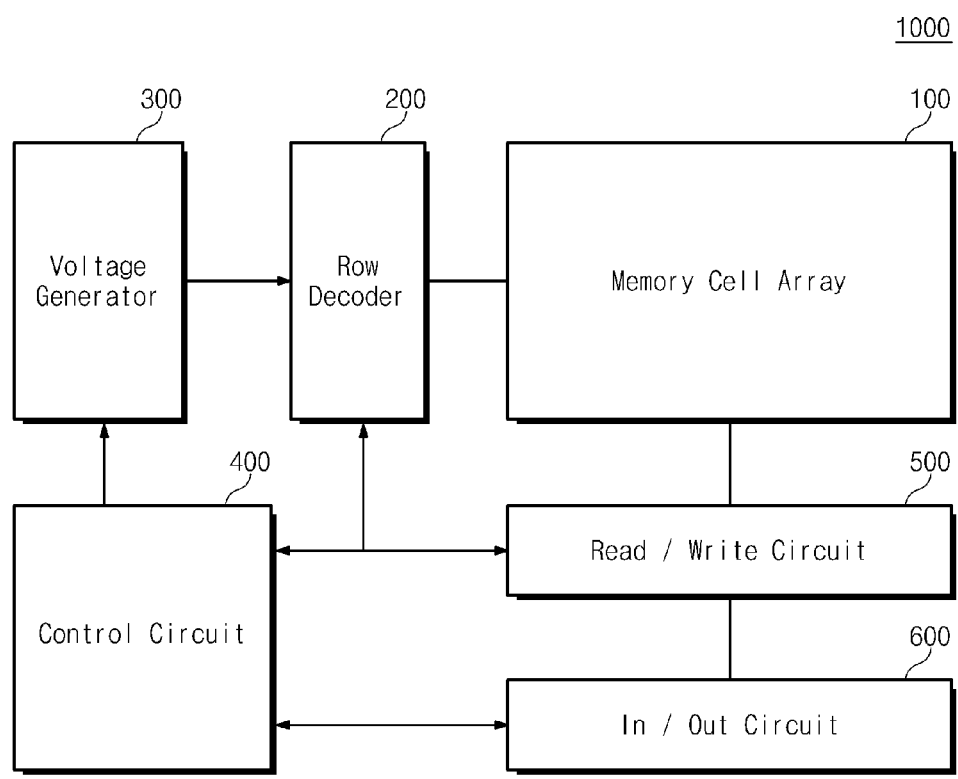
FIG. 5 is a block diagram of a multi-bit bit memory device according to one exemplary embodiment.

FIG. 5 is a block diagram of the multi-bit bit memory device 1000 according to one exemplary embodiment.

Referring to FIG. 5, the multi-bit memory device 1000 may be, for example, a NAND flash memory device as a nonvolatile memory device. However, it will be well understood that the inventive concept is not limited to a NAND flash memory device. The multi-bit memory device 1000 includes a memory cell array 100 having memory cells arranged in rows (word lines WL) and columns (bit lines BL). Each memory cell stores 1-bit data or M-bit data (M: an integer equal to or greater than 2). Each memory cell may be implemented using a memory cell with a charge storage layer such as a charge trap layer or a floating gate, a memory cell with a variable resistor, or the like. The memory cell array 100 may be configured to have a single-layer array structure (or a two-dimensional array structure) or a multi-layer array structure (or a three-dimensional array structure). Examples of the three-dimensional array structure are disclosed in U.S. Patent Application Publication No. 2008/0023747 titled "SEMICONDUCTOR MEMORY DEVICE WITH MEMORY CELLS ON MULTIPLE LAYERS" and U.S. Patent Application Publication No. 2008/0084729 titled "SEMICONDUCTOR DEVICE WITH THREE-DIMENSIONAL ARRAY STRUCTURE", the contents of which are hereby incorporated by reference.

A row decoder 200 is configured to select/drive the rows of the memory cell array 100. A voltage generator 300 is controlled by a control circuit 400 and is configured to generate word line voltages for program/erase/read operations (e.g., a program voltage, a pass voltage, and a read voltage). The control circuit 400 is configured to control an overall operation of the flash memory device 1000. A read/write circuit 500 is controlled by the control circuit 400 and operates as a sense amplifier or a write driver according to a mode of operation. For example, in a read operation, the read/write circuit 500 operates as a sense amplifier that senses data from memory cells of a selected row. In a program operation, the read/write circuit 500 operates as a write driver that drives memory cells of a selected row according to program data. The read/write circuit 500 includes page buffers corresponding respectively to bit lines or bit line pairs. If each of the memory cells stores multi-bit data, each page buffer of the read/write circuit 500 is configured to have two or more latches. An input/output (I/O) circuit 600 is configured to interface with the external source (e.g., the controller or the host).

Figure 6:
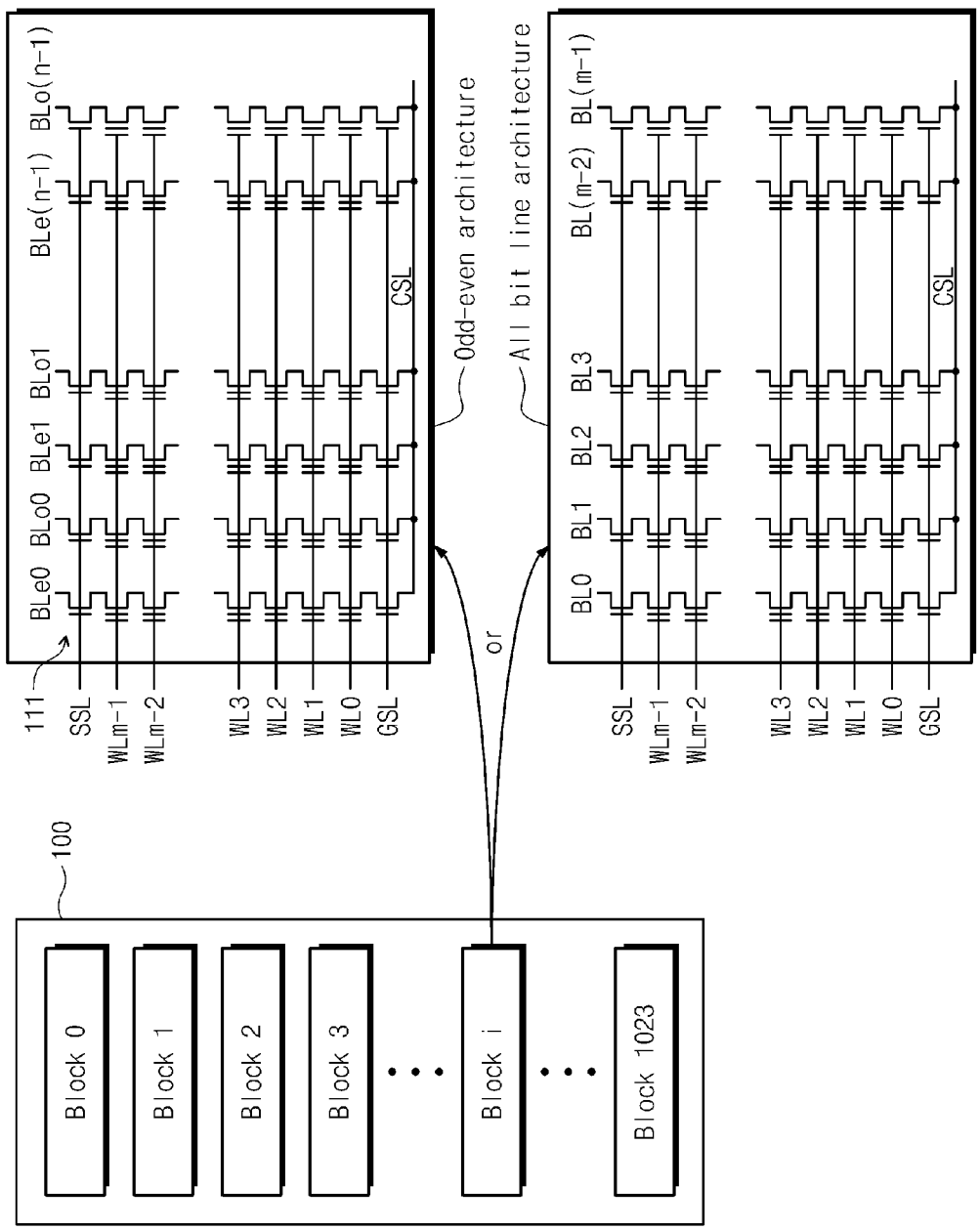
FIG. 6 is a diagram illustrating an example of configuring a memory cell array with memory blocks for all-bit-line (ABL) memory architecture or odd-even memory architecture.

FIG. 6 is a diagram illustrating an example of configuring the memory cell array 100 with memory blocks for the All-Bit-Line (ABL) memory architecture or the odd-even memory architecture. Exemplary structures of the memory cell array 100 will be described with reference to FIG. 6. There will be described an example that a NAND flash memory device has a memory cell array 100 divided into 1024 memory blocks. Data stored in each memory block may be erased simultaneously. In an exemplary embodiment, the memory block is the minimum unit of storage elements that are erased simultaneously. For example, each memory block includes a plurality of columns corresponding respectively to bit lines (e.g., 1 KB bit lines). In an exemplary embodiment called the All-Bit-Line (ABL) architecture, all the bit lines of each memory block may be simultaneously selected in read/program operations. Storage elements, which belong to a common word line and are connected to all bit lines, may be programmed simultaneously.

In an exemplary embodiment, a plurality of storage elements in the same column are connected in series to constitute a NAND string 111. One terminal of the NAND string 111 is connected to the corresponding bit line through a selection transistor controlled by a string selection line SSL, and the other terminal thereof is connected to a common source line CSL through a selection transistor controlled by a ground selection line GSL.

In another exemplary embodiment called the odd-even architecture, bit lines are divided into even bit lines BLe and odd bit lines BLo. In the odd-even bit line architecture, storage elements in a common word line connected to odd bit lines are programmed in a first time, and storage elements in a common word line connected to even bit lines are programmed in a second time. Data may be programmed in different blocks and may be read from different blocks. These operations may be performed simultaneously.

Figure 7:
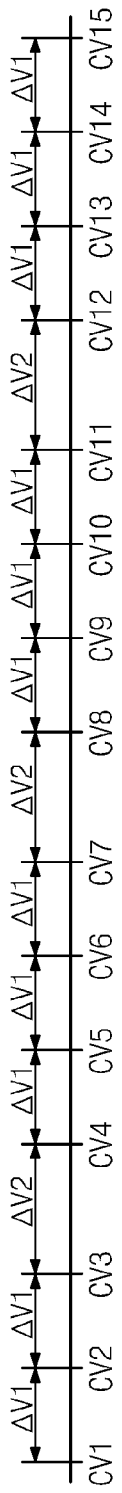
FIG. 7 is a diagram illustrating verify voltages for a coarse program operation of a multi-bit memory device according to an exemplary embodiment.

FIG. 7 is a diagram illustrating verify voltages for a coarse program operation of a multi-bit memory device according to an exemplary embodiment.

As described with reference to FIG. 2, the 1-step programmed memory cells in a source state E are programmed to have one of a first group of target states E, P1', P2' and P3' according to data to be programmed. Verify voltages CV1, CV2 and CV3 in the first group are used to verify each of the first group of target states E, P1', P2' and P3'. The 1-step programmed memory cells in a source state Q1 are programmed to have one of a second group of target states P4', P5', P6' and P7' according to data to be programmed. Verify voltages CV4, CV5, CV6 and CV7 in the second group are used to verify each of the second group of target states P4', P5', P6' and P7'. The 1-step programmed memory cells in a source state Q2 are programmed to have one of a third group of target states P8', P9', P10' and P11' according to data to be programmed. Verify voltages CV8, CV9, CV10 and CV11 in the third group are used to verify each of the third group of target states P8', P9', P10' and P11'. The 1-step programmed memory cells in a source state Q3 are programmed to have one of a fourth group of target states P12', P13', P14' and P15' according to data to be programmed. Verify voltages CV12, CV13, CV14 and CV15 in the fourth group are used to verify each of the fourth group of target states P12', P13', P14' and P15'.

In an exemplary embodiment of the inventive concept, the control circuit 400 of FIG. 5 controls the voltage generator 300 to generate the verify voltages CV1~CV15 necessary to verify a coarse program operation. In particular, the voltage generator 300 generates the verify voltage CV1~CV15 such that a voltage difference between verify voltages necessary to verify adjacent states each in adjacent groups (or adjacent verify voltage groups) each formed of target states is greater than a voltage difference between verify voltages necessary to verify states within each group (or each verify voltage group). For example, as illustrated in FIG. 7, a voltage difference between adjacent groups, i.e., a voltage difference $\Delta V2$ between a verify voltage CV3 in the first group and a verify voltage CV4 in the second group is greater than a voltage difference 66 V1 between verify voltages within each group. The voltage difference $\Delta V2$ between the verify voltage CV7 in the second group and the verify voltage CV8 in the third group is greater than the voltage difference $\Delta V1$ between the verify voltages in each group. The voltage difference $\Delta V2$ between the verify voltage CV11 in the third group and the verify voltage CV12 in the fourth group is greater than the voltage difference $\Delta V1$ between the verify voltages in each group. Each $\Delta V1$ may have different values in certain groups than in others, and each $\Delta V2$ may have different values between certain groups than between others, but in one embodiment, all voltage differences $\Delta V2$ between groups are larger than any voltage difference $\Delta V1$ between adjacent states within a group.

Figure 8:
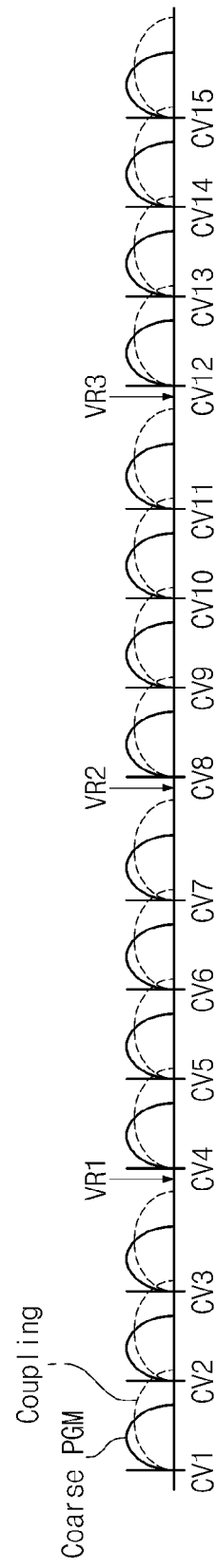
FIG. 8 is an exemplary diagram illustrating threshold voltage distributions after the coarse program operation when the verify voltages for the coarse program operation of FIG. 7 are applied to the multi-bit memory device.

FIG. 8 is a diagram illustrating threshold voltage distributions after the coarse program operation when the verify voltages for the coarse program operation of FIG. 7 are applied to the multi-bit memory device.

Referring to FIG. 8, states denoted by a solid line represent threshold voltage distributions generated after a coarse program operation, and states denoted by a dotted line represent threshold voltage distributions of coarse-programmed memory cells that have undergone the coupling. Since the voltage difference $\Delta V2$ is set to be greater than the voltage difference $\Delta V1$, it is possible to discriminate the respective groups by the read voltages VR1, VR2 and VR3. The groups correspond respectively to the states E, Q1, Q2 and Q3 before the coarse program operation is performed. That is, it is possible to read data (first 2-bit data) stored through the 1-step program operation by setting the verify voltages as described above. This read operation is referred to as an initial read operation. In other words, it is possible to read the 1-step programmed data through the initial read operation.

As described above, the fine program operation requires all of previously stored data. To this end, the controller 2000 of FIG. 4 must retain the data stored in memory cells whose coarse program operation is not completed. However, according to one embodiment, the first 2-bit data stored through the 1-step program operation are read through an initial read operation and the remaining 2-bit data are provided from the controller 2000 (or the remaining 2-bit data may be retained by the multi-bit memory device). This will be described below in more detail. A fine program operation on each word line may be performed in the same way. For convenience' sake, a fine program operation on the first word line WL0 will be described as an example. A coarse program operation on memory cells in the word line WL0 is performed in substantially the same way as described with reference to FIGS. 7 and 8. That is, the coarse program operation is performed by the verify voltages CV1~CV15 as described with reference to FIG. 7. The verify voltages CV1~CV15 for the coarse program operation are generated by the voltage generator 300 under the control of the control circuit 400.

When a command informing the coarse program operation on the word line WL0 is transmitted from the controller 2000 to the multi-bit memory device 1000, the multi-bit memory device 1000 performs an initial read operation by using the read voltages VR1, VR2 and VR3 of FIG. 8. The first 2-bit data stored in the memory cells of the word line WL0 (the first 2-bit data stored through the 1-step program operation) are read through the initial read operation. Then, the controller 2000 transmits the remaining data to be stored in the memory cells of the word line WL0 (the remaining data to be stored through the coarse program operation) from the buffer memory to the multi-bit memory cell 1000. Thereafter, a fine program operation is performed on the basis of the data (the first 2-bit data) read through the initial read operation and the data (the remaining 2-bit data) transmitted from the controller 2000.

In one embodiment, the operation of transmitting the data from the controller 2000 to the multi-bit memory device 1000 may be performed before the initial read operation.

As can be seen from the above description, the first 2-bit data stored through the 1-step program operation are read through the initial read operation, and the remaining 2-bit data are provided from the controller 2000. This allows a decrease in the amount of data to be retained by the buffer memory of the controller 2000 and a decrease in the amount of I/O data between the controller 2000 and the multi-bit memory device 1000 in the fine program operation.

Figure 9:
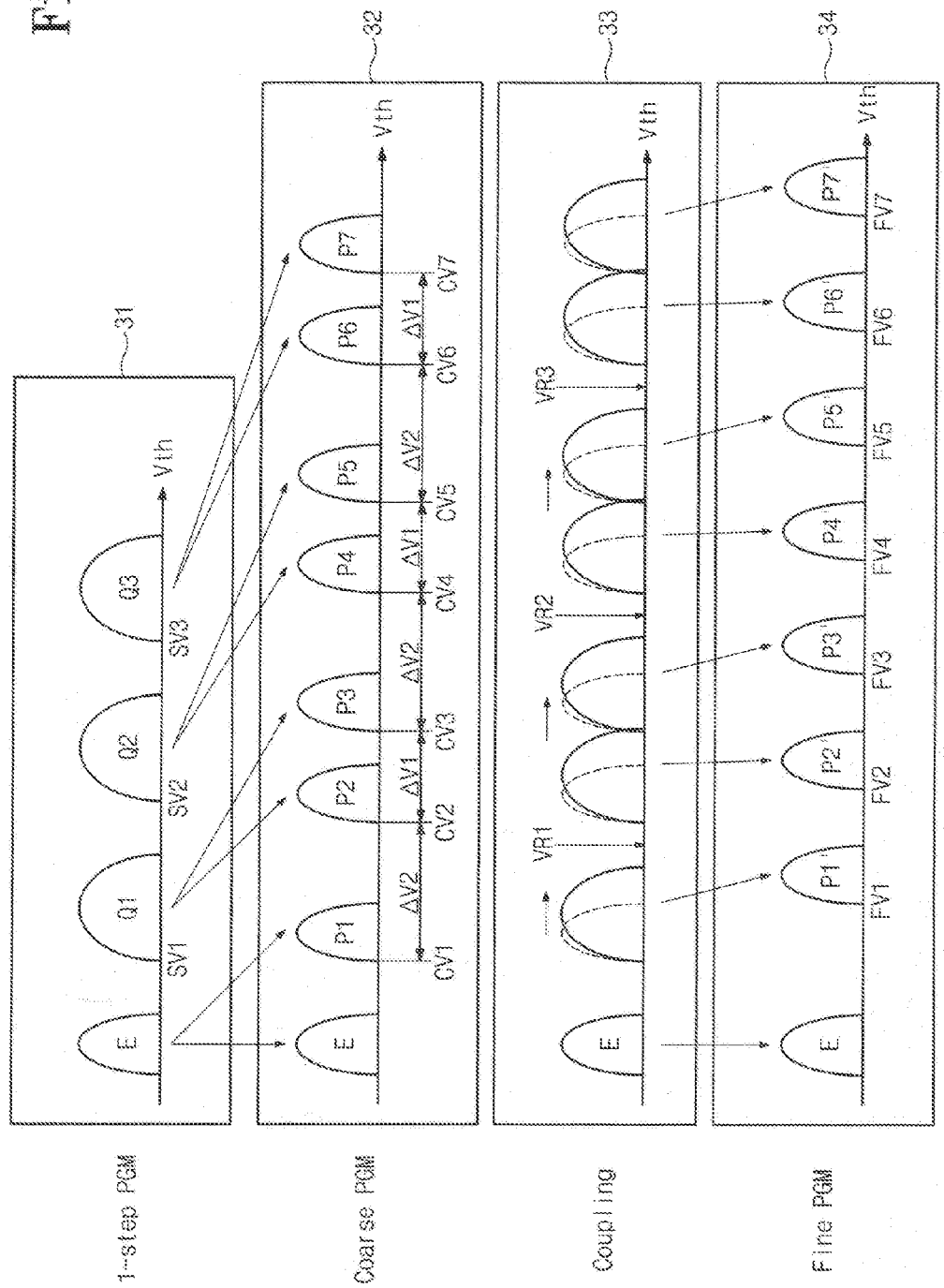
FIG. 9 is a diagram illustrating a method for setting verify voltages according to an exemplary embodiment.

It will be well understood that the method of setting the verify voltages is also applicable to a multi-bit memory device storing 3-bit data per cell. For example, referring to FIG. 9, in case of a multi-bit memory device storing 3-bit data per cell, first 2-bit data are first stored in each memory cells of a selected word line through a 1-step program operation. Threshold voltage distributions (e.g., states of E, Q1, Q2 and Q3) of the 1-step programmed memory cells are formed as illustrated in a box 31 of FIG. 9. In one embodiment, a first group of memory cells may be programmed to a state Q1 within states E and Q1~Q3 according to a verify voltage level SV1 within a range of SV1~SV3, and a second group of memory cells may be programmed to a state Q2 within states E and Q1~Q3 according to a verify voltage level SV2 within the range of SV1~SV3. The remaining 1-bit data is stored in each of the memory cells of the selected word line through a coarse program operation. The threshold voltage distributions (e.g., states of E and P1~P7) of the coarse programmed memory cells are formed as illustrated in a box 32 of FIG. 9. As illustrated in FIG. 9, memory cells in a source state E are programmed to have a first group of target states E and P1 according to data to be programmed. Memory cells in a source state Q1 are programmed to have one of a second group of target states P2 and P3 according to data to be programmed. Memory cells in a source state Q2 are programmed to have one of a third group of target states P4 and P5 according to data to be programmed. Memory cells in a source state Q3 are programmed to have one of a fourth group of target states P6 and P7 according to data to be programmed. In one embodiment, the first group of memory cells may be programmed to a state P2 or P3 within states P2 and P3 according to a verify voltage level CV2 or CV3 within a first range (e.g., between CV2 and CV3) and the second group of memory cells may be programmed to a state P4 or P5 within states P4 and P5 according to a verify voltage level CV4 or CV5 within a second range (e.g., between CV4 and CV5). The threshold voltage distributions of the coarse programmed memory cells after coupling are formed as illustrated in a box 33 of FIG. 9.

The voltage differences between the verify voltages CV1~CV7 are not set to be equal, but are set to be suitable to read previously programmed data (first and second page data). For example, the voltage difference ΔV2 between the verify voltage CV1 in the first group and the verify voltage CV2 in the second group is set to be greater than the voltage difference ΔV1 between the verify voltages CV2 and CV3 in the second group. The voltage difference ΔV2 between the verify voltage CV3 in the second group and the verify voltage CV4 in the third group is set to be greater than the voltage difference ΔV1 between the verify voltages CV4 and CV5 in the third group. The voltage difference ΔV2 between the verify voltage CV5 in the third group and the verify voltage CV6 in the fourth group is set to be greater than the voltage difference ΔV1 between the verify voltages CV6 and CV7 in the fourth group. Each ΔV1 may have different values in certain groups than in others, and each ΔV2 may have different values between certain groups than between others, but in one embodiment, all voltage differences ΔV2 between groups are larger than any voltage difference ΔV1 between adjacent states within a group.

Since the voltage difference ΔV2 between the verify voltages necessary to verify the adjacent states belonging respectively to the adjacent groups including the respective target states is set to be greater than the voltage difference ΔV1 between the verify voltages necessary to verify the states belonging to each group, it is possible to discriminate the respective groups by the read voltages VR1, VR2 and VR3. The groups correspond respectively to the states E, Q1, Q2 and Q3 before the performance of the coarse program operation. That is, it is possible to read the data (first 2-bit data) stored through the 1-step program operation by setting the verify voltages as described above. In other words, it is possible to read the 1-step programmed data through the initial read operation. Consequently, the first 2-bit data stored through the 1-step program operation are read through the initial read operation, and the remaining 1-bit data is provided from the controller 2000.

When a command informing a fine program operation on the word line WL0 is transmitted from the controller 2000 to the multi-bit memory device 1000, the multi-bit memory device 1000 performs a fine program operation to complete programming of the memory cells. As can be seen from FIG. 9, the verify voltages CV1~CV7 used to determine the threshold voltage distributions P1~P7 of the box 32 are lower than the corresponding verify voltages FV1~FV7 used to determine the final threshold voltage distributions P1'~P7' of the box 34. For example, the verify voltage CV1 used to determine the threshold voltage distribution P1 is lower than the corresponding verify voltage FV1 used to determine the final threshold voltage distribution P1'. A range of verify voltages FV1~FV7 can be partially overlapped with a range of verify voltages CV1~CV7. This allows a decrease in the amount of data to be retained by the buffer memory of the controller 2000 and a decrease in the amount of I/O data between the controller 2000 and the multi-bit memory device 1000 in the fine program operation, since only the final 1-bit needs to be transmitted from the controller 2000.

Figure 10:
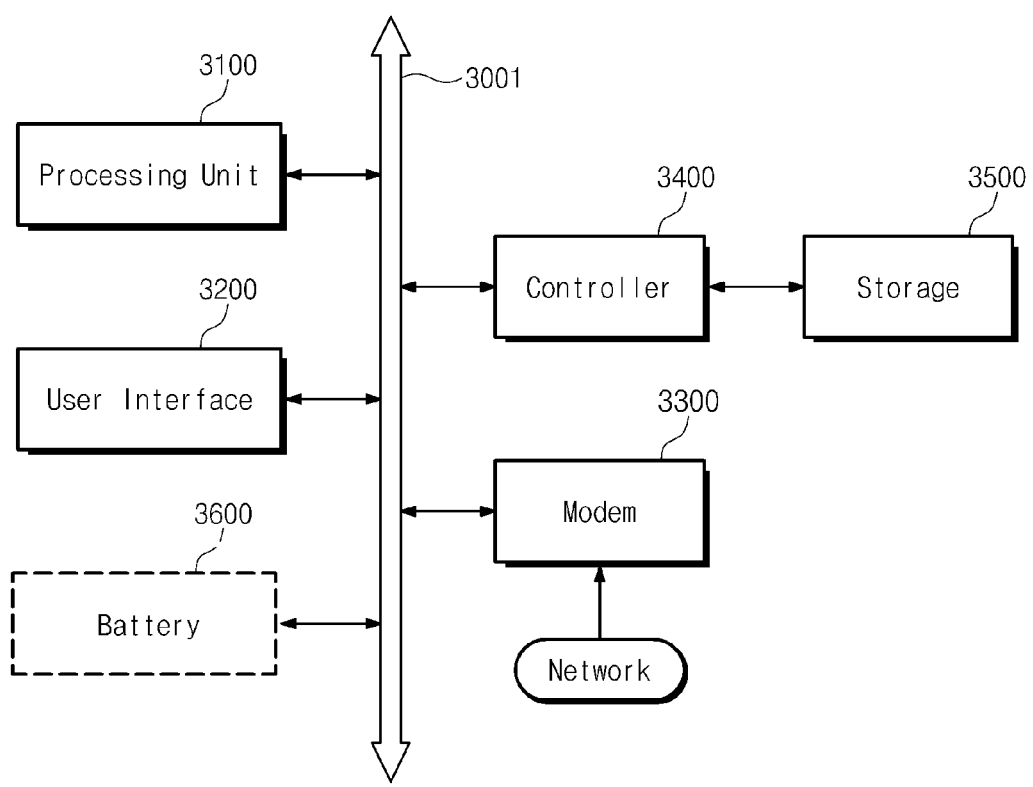
FIG. 10 is a block diagram of a computing system including a data storage system according to an exemplary embodiment.

FIG. 10 is a block diagram of a computing system including a data storage system according to an exemplary embodiment.

Referring to FIG. 10, a computing system according to an exemplary embodiment includes a processing unit (e.g., a microprocessor) 3100, a user interface 3200, a modem (e.g., a baseband chipset) 3300, a memory controller 3400, and a storage medium 3500. The storage medium 3500 may include a multi-bit memory device that is configured in substantially the same way as illustrated in FIG. 4. N-bit data (N: an integer equal to or greater than 1), which are or will be processed by the microprocessor 3100, may be stored through the memory controller 3400 in the storage medium 3500. If the computing system according to the inventive concept is a mobile device, the computing system may further include a battery 3600 for supplying an operation voltage of the computing system. Although not illustrated in FIG. 10, those skilled in the art will readily understand that the computing system according to the inventive concept may further include, for example, an application chipset, a camera image processor, and a mobile DRAM. For example, the memory controller 3400 and the storage medium 3500 may constitute a solid state drive/disk (SSD) that uses a nonvolatile memory device to store data.

Figure 11:
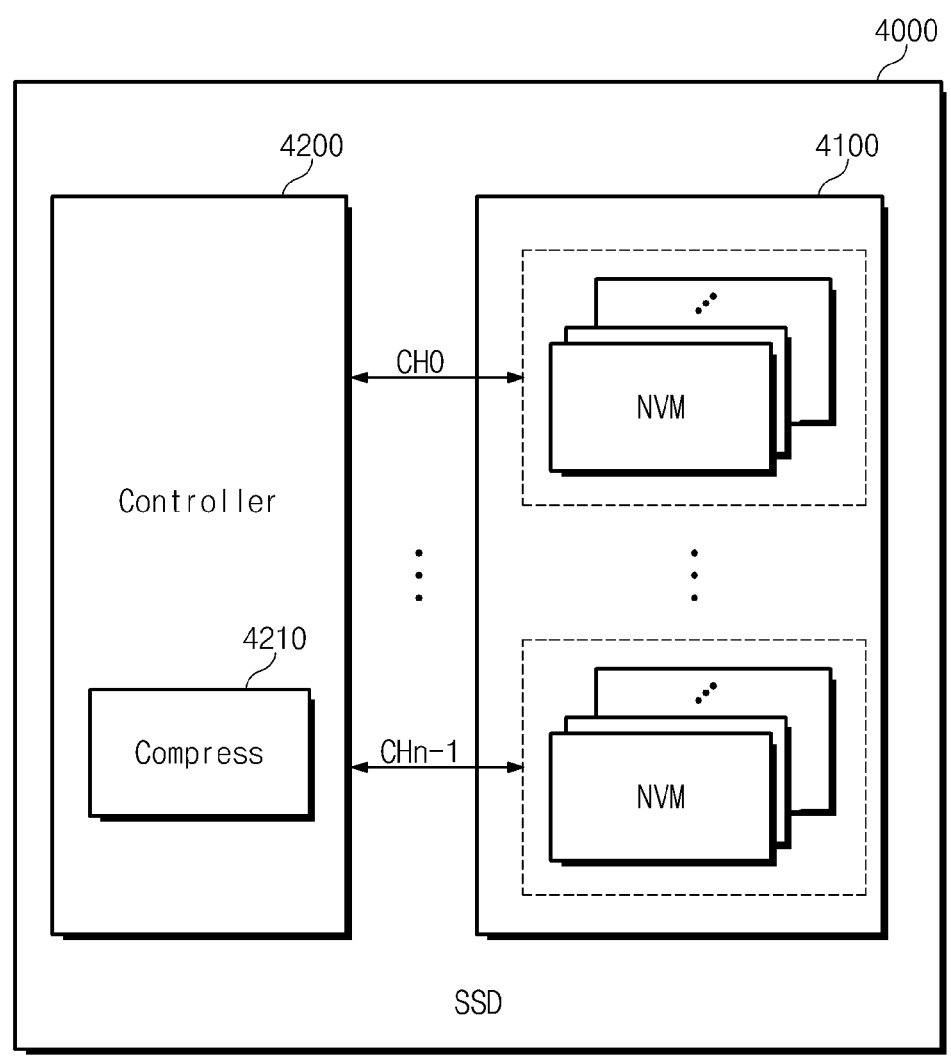
FIG. 11 is a block diagram of a solid state drive (SSD) including a data storage system according to an exemplary embodiment.

FIG. 11 is a block diagram of a solid state drive (SSD) including a data storage system according to an exemplary embodiment.

Referring to FIG. 11, a solid state drive (SSD) 4000 may include a storage medium 4100 and a controller 4200. The storage medium 4100 may be connected to the controller 4200 through a plurality of channels. A plurality of nonvolatile memory (NVM) devices may be connected in common to each of the channels. The controller 4200 and each of the nonvolatile memory devices of the storage medium 4100 are substantially the same as described above, and thus their description will be omitted for conciseness. The controller 4200 can be configured to compress data to be stored in the storage medium 4100 and decompress data read from the storage medium 4100. This can be accomplished through a compress block 4210, which operates at need. On the other hand, compressed data can be stored in the storage medium 4100 via the controller 4200 without the compress block 4210.

Figure 12:
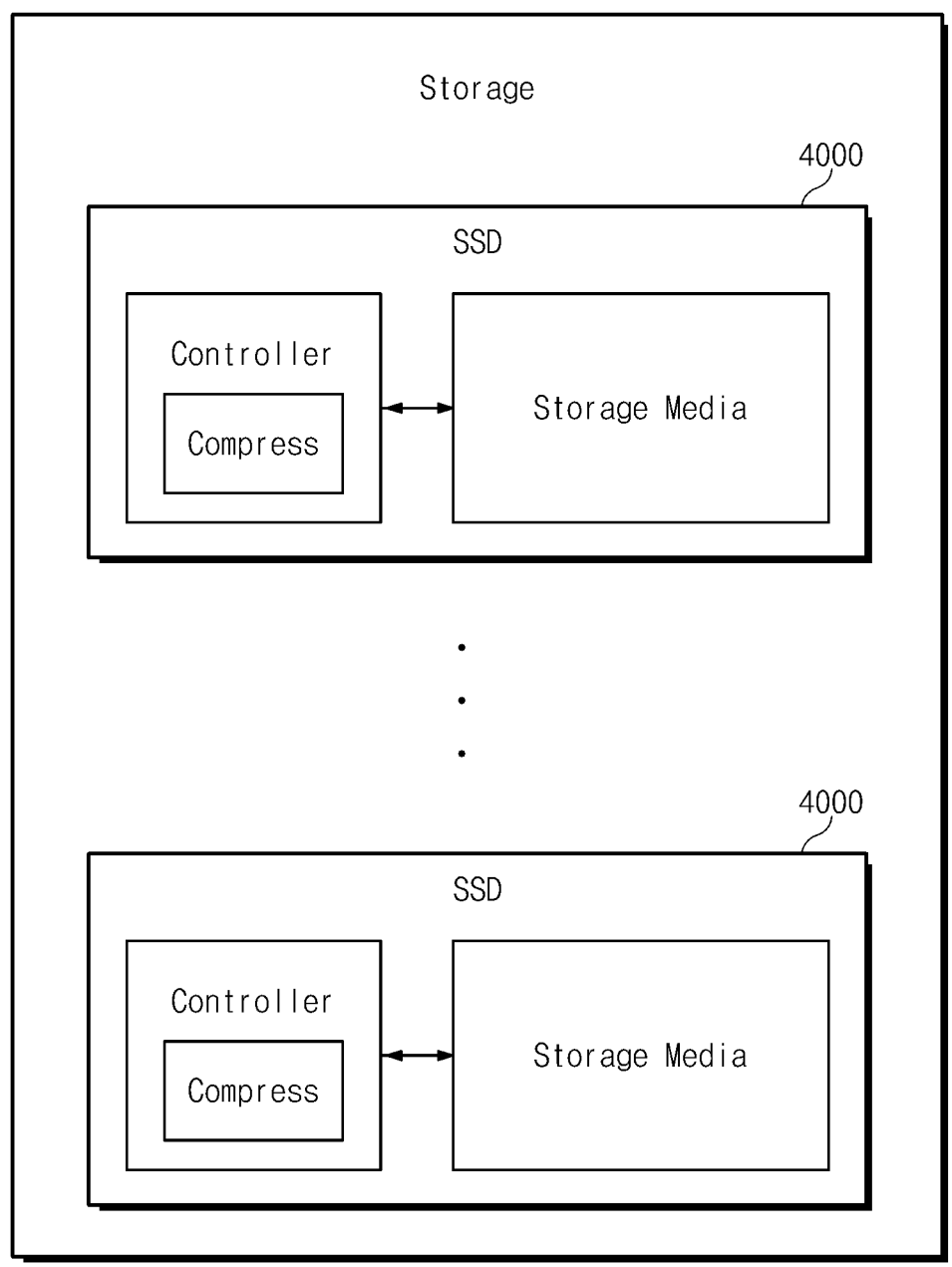
FIG. 12 is an exemplary block diagram of a storage using the SSD of FIG. 11.
Figure 13:
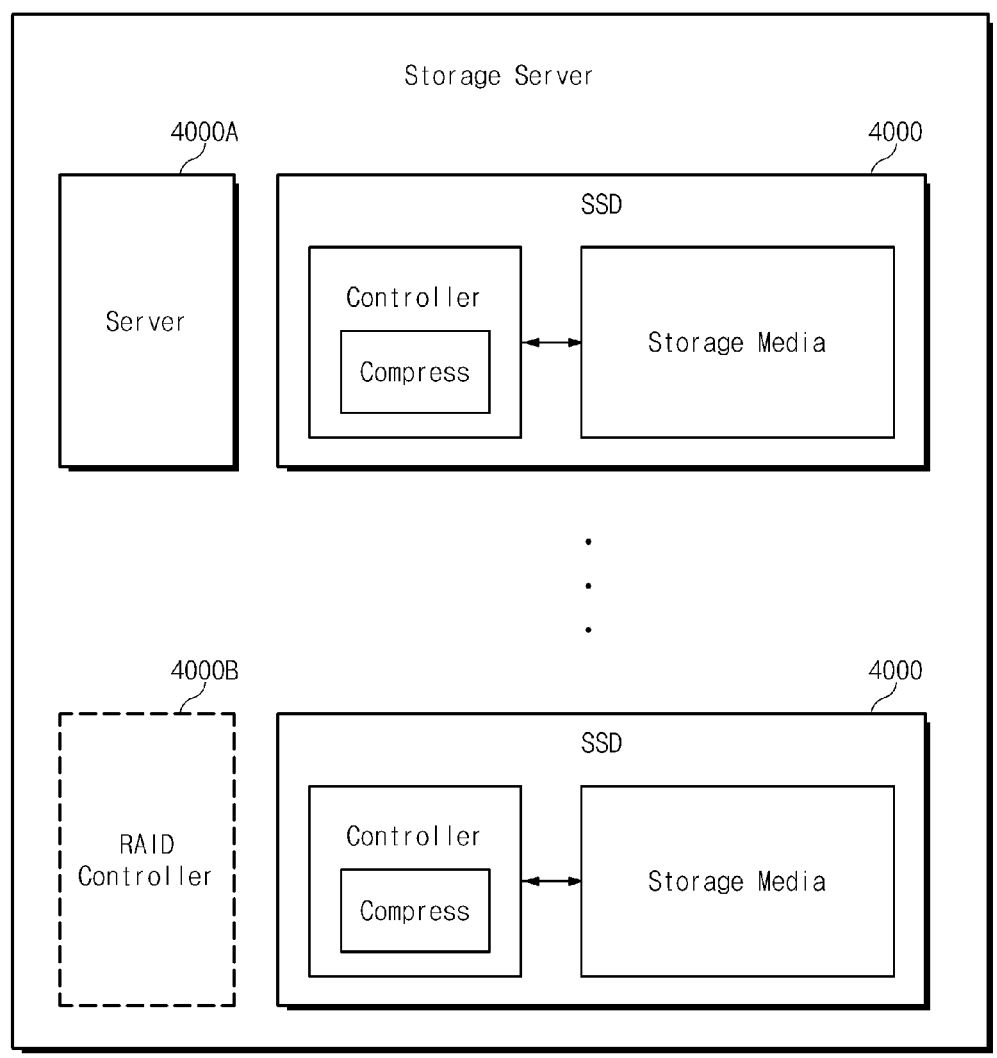
FIG. 13 is an exemplary block diagram of a storage server using the SSD of FIG. 11.

FIG. 12 is a block diagram of a storage using the SSD of FIG. 11. FIG. 13 is a block diagram of a storage server using the SSD of FIG. 11.

A solid state drive (SSD) 4000 according to an exemplary embodiment of the inventive concept may be used to constitute a storage. As illustrated in FIG. 12, the storage may include a plurality of SSDs that are configured in substantially the same way as described with reference to FIG. 11. A solid state drive (SSD) 4000 according to an exemplary embodiment of the inventive concept may be used to constitute a storage server. As illustrated in FIG. 13, the storage server may include a server 4000A and a plurality of SSDs that are configured in substantially the same way as described with reference to FIG. 11. Also, it will be well understood that the storage server may further include a well-known RAID controller 4000B.

In an exemplary embodiment of the inventive concept, the memory cells may be implemented using one of various cell structures with a charge storage layer. Examples of the cell structures with a charge storage layer include a charge trap flash structure using a charge trap layer, a stack flash structure with multi-layer stacked arrays, a vertical-channel memory structure with each string's channel formed vertically with respect to a substrate, a flash structure without a source/drain, and a pin-type flash structure.

Exemplary memory devices having a charge trap flash structure as a charge storage layer are disclosed in U.S. Pat. No. 6,858,906, U.S. Patent Application Publication No. 2004-0169238 and U.S. Patent Application Publication No. 2006-0180851, the contents of which are hereby incorporated by reference. An exemplary flash structure without a source/drain is disclosed in Korean Patent No. 673020, the contents of which are hereby incorporated by reference.

The flash memory device and/or the memory controller according to the inventive concept may be mounted in various types of packages. Examples of the packages of the flash memory device and/or the memory controller include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the exemplary embodiments control the verify voltage levels to read the first data stored through the 1-step program operation, thereby making it possible to reduce the amount of data to be retained by the buffer memory of the controller. Also, the exemplary embodiments make it possible to reduce the amount of I/O data between the controller and the multi-bit memory device in the fine program operation.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A program method for a multi-bit memory device comprising:
   a first step of programming a first group of memory cells of the multi-bit memory device to a first state of a first group of states according to a first verify voltage level of a first group of verify voltage levels, and programming a second group of memory cells of the multi-bit memory device to a second state of the first group of states according to a second verify voltage level of the first group of verify voltage levels; and
   a second step of programming each memory cell of the first group of memory cells to a state within a second group of states according to a verify voltage level of a second group of verify voltage levels within a first range of levels, and programming each memory cell of the second group of memory cells to a state within a third group of states according to a verify voltage level of a third group of verify voltage levels within a second range of levels,
   wherein the lowest verify voltage level in the second range of levels is higher than the highest verify voltage level in the first range of levels, and
   wherein a first voltage difference between adjacent verify voltage levels within the first range of levels is different from a second voltage difference between the highest verify voltage level of the second group of verify voltage levels and the lowest verify voltage level of the third group of verify voltage levels.

2. The program method of claim 1, wherein the second step of programming is performed by using data stored in the first and second groups of memory cells during the first step of programming.

3. The program method of claim 2, further comprising:
   a third step of programming each memory cell of the first group of memory cells to a state within a fourth group of states according to a verify voltage level of a fourth group of verify voltage levels within a third range of levels, and programming each memory cell of the second group of memory cells to a state within a fifth group of states according to a verify voltage level of a fifth group of verify voltage levels within a fourth range of levels,
   wherein the lowest verify voltage level in the fourth range of levels is higher than the highest verify voltage level in the third range of levels, and
   wherein the third step of programming is performed by using data stored in each memory cell of the first and second groups of memory cells during the second step of programming.

4. The program method of claim 3,
   wherein the first and second groups of memory cells are part of a memory cell array, and
   wherein the third step of programming is further performed by using data from outside of the memory cell array.

5. The program method of claim 2, wherein during the second step of programming, the data stored in the first and second groups of memory cells after the first step of programming are read.

6. The program method of claim 1, wherein the first voltage difference is smaller than the second voltage difference.

7. The program method of claim 1, wherein each of the memory cells stores M-bit data, M being an integer equal to or greater than 3.

8. A program method for a multi-bit memory device comprising:

programming a first group of memory cells of the multi-bit memory device, the programming comprising:
for each memory cell of the first group of memory cells, programming the memory cell to a state within a first group of states, based on a verify voltage level of a first group of verify voltage levels within a first range of levels; and programming a second group of memory cells of the multi-bit memory device, the programming comprising:
for each memory cell of the second group of memory cells, programming the memory cell to a state within a second group of states, based on a verify voltage level of a second group of verify voltage levels within a second range of levels, wherein the lowest verify voltage level in the second range of levels is higher than the highest verify voltage level in the first range of levels, and wherein a first voltage difference between adjacent verify voltage levels within the first range of levels is smaller than a second voltage difference between the highest verify voltage level of the second group of verify voltage levels and the lowest verify voltage level of the third group of verify voltage levels.

9. A multi-bit memory device comprising:
a memory cell array having memory cells arranged in rows and columns;
a voltage generator configured to generate word line voltages to be applied to a selected word line of the memory cell array; and
a control circuit configured to control the voltage generator to operate a first step of programming and a second step of programming, wherein the first step of programming includes programming a first group of memory cells of the multi-bit memory device to a first state of a first group of states according to a first verify voltage level of a first group of verify voltage levels, and programming a second group of memory cells of the multi-bit memory device to a second state of the first group of states according to a second verify voltage level of the first group of verify voltage levels, wherein the second step of programming includes programming each memory cell of the first group of memory cells to a state within a second group of states according to a verify voltage of a second group of verify voltage levels within a first range of levels, and programming each memory cell of the second group of memory cells to a state within a third group of states according to a verify voltage of a third group of verify voltage levels within a second range of levels, wherein the lowest verify voltage level in the second range of levels is higher than the highest verify voltage level in the first range of levels, and wherein a first voltage difference between adjacent verify voltage levels within the first range of levels is different from a second voltage difference between the highest verify voltage level of the second group of verify voltage levels and the lowest verify voltage level of the third group of verify voltage levels.

10. The multi-bit memory device of claim 9, wherein the second step of programming is performed by using data stored in the first and second groups of memory cells during the first step of programming.

11. The multi-bit memory device of claim 10, wherein the control circuit is further configured to control the voltage generator to operate a third step of programming, wherein the third step of programming includes programming each memory cell of the first group of memory cells to a state within a fourth group of states according to a verify voltage level of a fourth group of verify voltage levels within a third range of levels, and programming each memory cell of the second group of memory cells to a state within a fifth group of states according to a verify voltage level of a fifth group of verify voltage levels within a fourth range of levels, wherein the lowest verify voltage level in the fourth range of levels is higher than the highest verify voltage level in the third range of levels, and wherein the third step of programming is performed by using data stored in each memory cell of the first and second groups of memory cells during the second step of programming.

12. The multi-bit memory device of claim 11, wherein the third step of programming is further performed by using data from outside of the memory cell array.

13. The multi-bit memory device of claim 9, wherein each of the memory cells stores M-bit data, M being an integer equal to or greater than 3.

14. The multi-bit memory device of claim 9, wherein the first voltage difference is smaller than the second voltage difference.

15. A data storage system comprising:
a multi-bit memory device of claim 9; and
a controller configured to control the multi-bit memory device.

16. The data storage system of claim 15, wherein the second step of programming is performed by using data stored in the first and second groups of memory cells during the first step of programming.

17. The data storage system of claim 16, wherein the control circuit is further configured to control the voltage generator to operate a third step of programming, wherein the third step of programming includes programming each memory cell of the first group of memory cells to a state within a fourth group of states according to a verify voltage level of a fourth group of verify voltage levels within a third range of levels, and programming each memory cell of the second group of memory cells to a state within a fifth group of states according to a verify voltage level of a fifth group of verify voltage levels within a fourth range of levels, wherein the lowest verify voltage level in the fourth range of levels is higher than the highest verify voltage level in the third range of levels, and wherein the third step of programming is performed by using data stored in each memory cell of the first and second groups of memory cells during the second step of programming.

18. The data storage system of claim 17,
wherein the first and second groups of memory cells are part of the memory cell array, and
wherein the third step of programming is further performed by using data from outside of the memory cell array.

19. The data storage system of claim 15, wherein each of the memory cells stores M-bit data, M being an integer equal to or greater than 3.

20. The data storage system of claim 15, wherein the multi-bit memory device and the controller constitute a solid state drive (SSD).

* * * * *